United States Patent
Weng

(10) Patent No.: US 11,093,075 B2
(45) Date of Patent: Aug. 17, 2021

(54) ELECTRONIC DEVICE

(71) Applicant: InnoLux Corporation, Miao-Li County (TW)

(72) Inventor: Tsan-Po Weng, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 16/925,441

(22) Filed: Jul. 10, 2020

(65) Prior Publication Data

US 2021/0034215 A1 Feb. 4, 2021

(30) Foreign Application Priority Data

Jul. 31, 2019 (CN) .......................... 201910700933.4

(51) Int. Cl.
*G06F 3/041* (2006.01)
*H03K 17/96* (2006.01)

(52) U.S. Cl.
CPC ...... *G06F 3/04164* (2019.05); *G06F 3/04166* (2019.05); *H03K 17/96* (2013.01); *H03K 2017/9604* (2013.01)

(58) Field of Classification Search
CPC .............. G06F 3/0412; G06F 3/04164; G06F 3/04166; H03K 17/96; H03K 2017/9604
See application file for complete search history.

(56) References Cited

U.S. PATENT DOCUMENTS

| 9,671,888 B2 | 6/2017 | Kim et al. | |
|---|---|---|---|
| 9,904,390 B2 | 2/2018 | Liu | |
| 2010/0086112 A1* | 4/2010 | Jiang | H04M 3/42042 379/93.23 |
| 2015/0199039 A1* | 7/2015 | Hofmann | G06F 21/36 345/173 |

FOREIGN PATENT DOCUMENTS

| CN | 106598320 A | 4/2017 |
|---|---|---|
| TW | I598783 B | 9/2017 |

* cited by examiner

*Primary Examiner* — Insa Sadio
(74) *Attorney, Agent, or Firm* — McClure, Qualey & Rodack, LLP

(57) ABSTRACT

An electronic device includes a substrate, a plurality of data lines, a plurality of data switches, a plurality of sensing electrodes, and a plurality of touch switches. The data lines and the sensing electrodes are arranged on the substrate. The plurality of data switches respectively have a first connection end and a second connection end, and the plurality of touch switches respectively have a third connection end and a fourth connection end. The first connection end of the plurality of data switches respectively couple to one of the plurality of the data lines. The third connection end of the plurality of touch switches respectively couple to one of the plurality of the sensing electrodes, and the fourth connection end of the plurality of touch switches respectively couple to the second connection end of one of the plurality of data switches.

20 Claims, 7 Drawing Sheets

ELECTRONIC DEVICE

CROSS REFERENCE TO RELATED APPLICATIONS

This application claims priority to and the benefit of China Application 201910700933.4, filed on Jul. 31, 2019, the entirety of which is incorporated by reference herein.

FIELD OF THE DISCLOSURE

The disclosure relates to an electronic device, especially to an electronic device employing touch-sensing techniques.

DESCRIPTION OF THE RELATED ART

In recent years, in order to achieve portability, user-friendly operation, etc., many electronic devices have been equipped with touch sensors as input devices to replace a traditional keyboard or mouse. Among these electronic devices with such touch sensors as input devices, electronic devices integrating touch displays with touch and display functions are modern, high-profile products.

With the increasing size of touch displays, the number of touches required for sensing has also increased, meaning that there are not enough pins in a single touch and display driver (Touch and Display Driver Integration, TDDI) for them to be of any use. In addition, if multiple touch and display chips are used, the overall bill-of-materials cost (BOM cost) may be too high. Therefore, the development of products that increase the number of touch sensors at a low BOM cost is still one of the topics currently being researched in the industry.

BRIEF SUMMARY OF THE DISCLOSURE

According to some embodiments of the present disclosure, an electronic device is provided, wherein the electronic device includes a substrate, a plurality of data lines, a plurality of data switches, a plurality of sensing electrodes, and a plurality of touch switches. The substrate has a peripheral area. The plurality of data lines are arranged on the substrate. The plurality of data switches are arranged in the peripheral area of the substrate. The plurality of data switches have a first connection end and a second connection end. The first connection end of the plurality of data switches couples to one of the plurality of data lines. The plurality of sensing electrodes are arranged on the substrate. The plurality of touch switches are arranged in the peripheral area of the substrate. The plurality of touch switches respectively have a third connection end and a fourth connection end. The third connection end of the plurality of touch switches couples to one of the plurality of sensing electrodes, and the fourth connection end of the plurality of touch switches couples to the second connection end of one of the plurality of data switches.

BRIEF DESCRIPTION OF THE DRAWINGS

The disclosure can be more fully understood by reading the subsequent detailed description with references made to the accompanying figures. It should be understood that the figures are not drawn to scale in accordance with standard practice in the industry. In fact, it is allowed to arbitrarily enlarge or reduce the size of components for clear illustration.

DETAILED DESCRIPTION OF THE DISCLOSURE

In order to make the above purposes, features, and advantages of some embodiments of the present disclosure more comprehensible, the following is a detailed description in conjunction with the accompanying drawing.

It is understood that the words "comprise" and include used in the present disclosure are used to indicate the existence of specific technical features, values, method steps, operations, units and/or components. However, it does not exclude that more technical features, numerical values, method steps, work processes, units, components, or any combination of the above can be added.

The words "first", "second", "third", "fourth", "fifth", "sixth", "seventh", and "eighth" are used to describe components, they are not used to indicate the priority order of or advance relationship, but only to distinguish components with the same name.

In the present disclosure, it can be any suitable type of electronic device, such as a touch display, an antenna device, a splicing device, a sensing device, a flexible device, etc., but is not limited thereto. The electronic device described in the present disclosure is a touch display with touch and display functions, and the display may include liquid crystal (LC), organic light-emitting diode (OLED), inorganic light-emitting diode (LED) such us micro-LED, mini-LED, quantum dots (QDs), QLED, QDLED, fluorescence, phosphor, or a combination of the above materials, but is not limited thereto. The spicing device may be, for example, a display splicing device or an antenna splicing device, but is not limited thereto. In addition, the display in the electronic device may be a color display or a monochrome display, and the shape of the electronic device may be rectangular, circular, polygonal, a shape with curved edges, or other suitable shapes. In addition, the electronic device described below uses, as an example, the sensing of a touch through an embedded touch display, but the touch-sensing method is not limited thereto, and another suitable touch-sensing method can be used provided that it meets all requirements.

Figure 1:
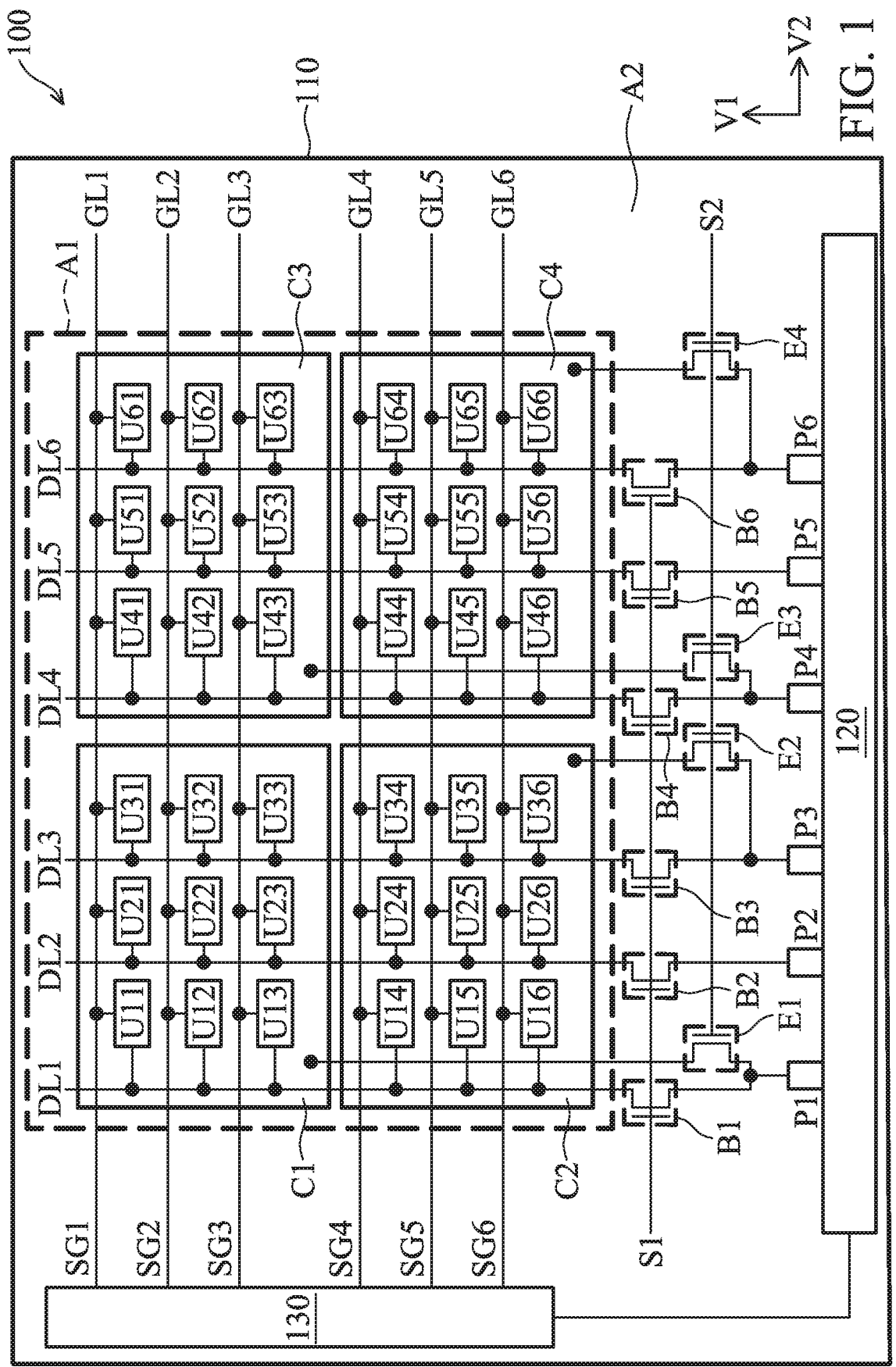
FIG. 1 shows a schematic diagram of an electronic device in accordance with some embodiments of the disclosure.
Figure 2:
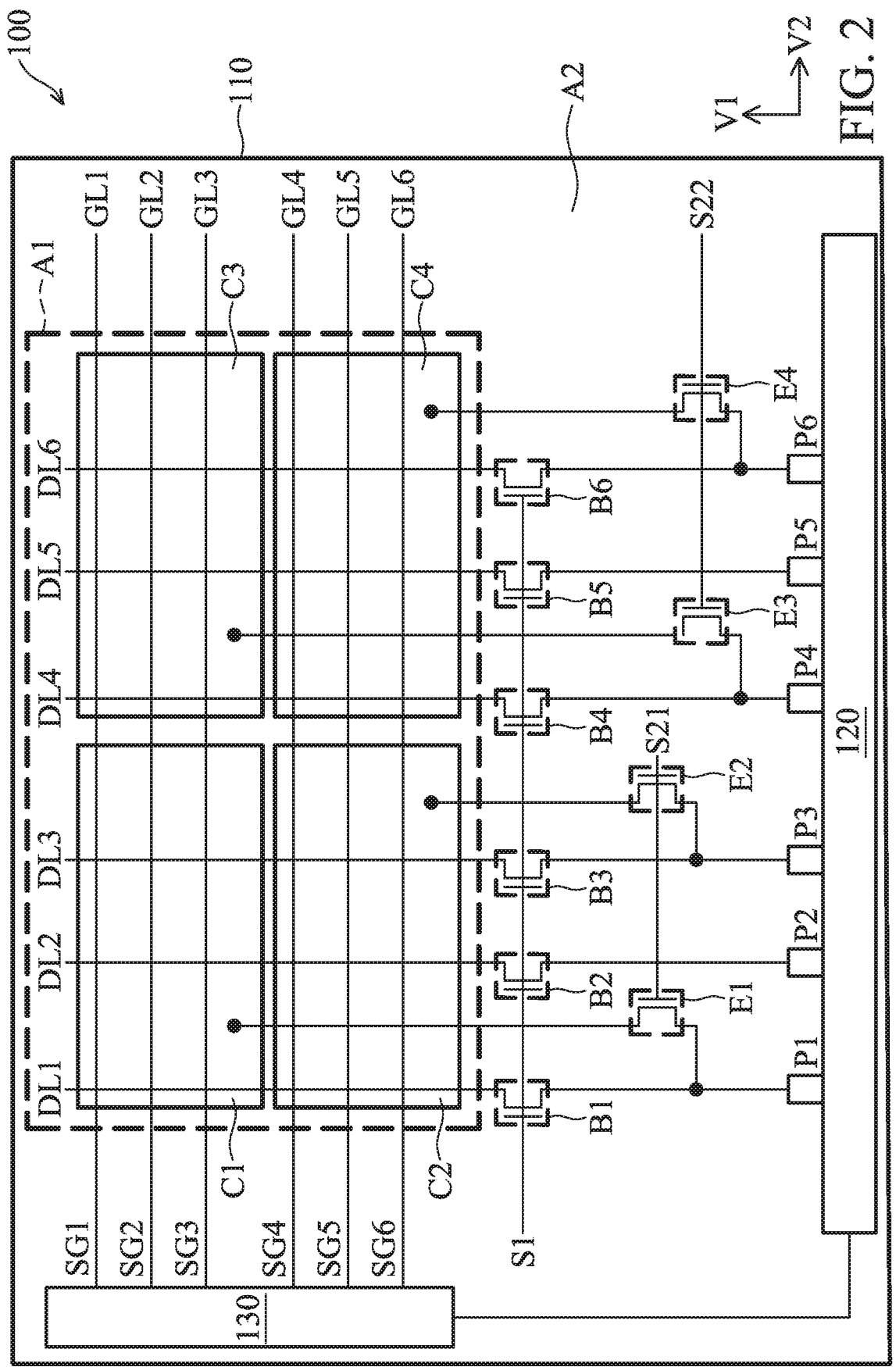
FIG. 2 shows a schematic diagram of an electronic device in accordance with some embodiments of the disclosure.
Figure 3:
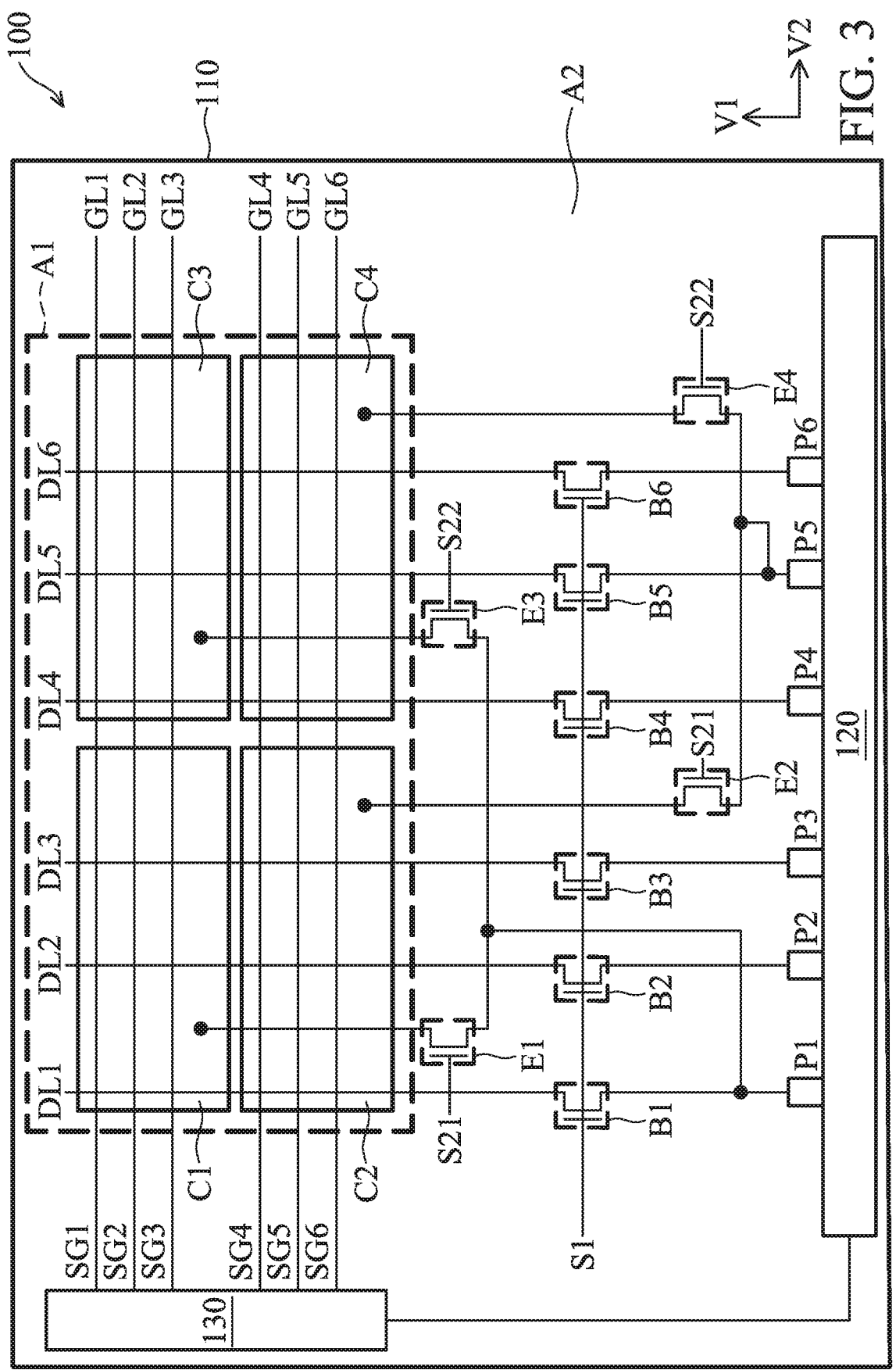
FIG. 3 shows a schematic diagram of an electronic device in accordance with some embodiments of the disclosure.

Refer to FIG. 1 to FIG. 3. An electronic device 100 can provide a touch display function for the user to operate. In some embodiments, the electronic device 100 can achieve a touch display function by integrating a touch display in the electronic device.

In some embodiments, the electronic device 100 may include a substrate 110, a plurality of data lines DL1-DL6, a plurality of data switches B1-B6, a plurality of sensing electrodes C1-C4, and a plurality of touch switches E1-E4. Wherein the substrate 110, the plurality of data lines DL1-DL6, the plurality of data switches B1-B6, the plurality of sensing electrodes C1-C4, and the plurality of touch switches E1-E4 are parts of the touch display.

Furthermore, in some embodiments, the electronic device 100 further includes a plurality of gate lines GL1-GL6 and a plurality of pixel units U11-U66. Wherein the gate lines GL1-GL6 and the pixel units U11-U66 are also parts of the touch display. In some embodiments, the touch display is an embedded touch display. In addition, the touch display may be an LED touch display, an LCD touch display, an OLED touch display etc., but is not limited thereto.

6 data lines DL1-DL6, 6 data switches B1-B6, 4 sensing electrodes C1-C4, 4 touch switches E1-E4, 6 gate lines GL1-GL6 and 36 pixel units U11-U66 are used as an example to illustrate. Wherein the number of the plurality of data switches corresponds to the number of the plurality of data lines, the number of the plurality of touch switches corresponds to the number of the plurality of sensing electrodes. However, it should be noted that the aforementioned quantities may depend on the actual product design and application, and are not limited thereto. For example, when the resolution specification of the touch display is 1920 RGB*720, the number of data lines can reach 5760 (1920*3), and the number of gate lines can reach 720.

The plurality of data lines DL1-DL6 and the plurality of gate lines GL1-GL6 are arranged on the substrate 110, and the plurality of data lines DL1-DL6 and the plurality of gate lines GL1-GL6 are intersected to define a plurality of pixel regions.

Herein, the data lines DL1-DL6 may extend along a first direction V1 and be arranged along a second direction V2. The gate lines GL1-GL6 may extend along the second direction V2 and be arranged along the first direction V1. The first direction V1 is different from the second direction V2. In some embodiments, the shape of the pixel area defined by the data lines DL1-DL6 and the gate lines GL1-GL6 may be rectangular, parallelogram, bent, or other suitable shapes. The substrate 110 may be a glass substrate, a quartz substrate, a sapphire substrate, or a substrate of other suitable materials. In addition, the substrate 110 may be a rigid substrate or a bendable substrate, such as curved, S-shaped, wavy, etc., but is not limited thereto.

As shown in FIG. 1, the plurality of pixel units U11-U66 can be arranged in an array into a pixel array, and the pixel units U11-U66 respectively couple to one of the data lines DL1-DL6 and one of the gate lines GL1-GL6.

Figure 4:
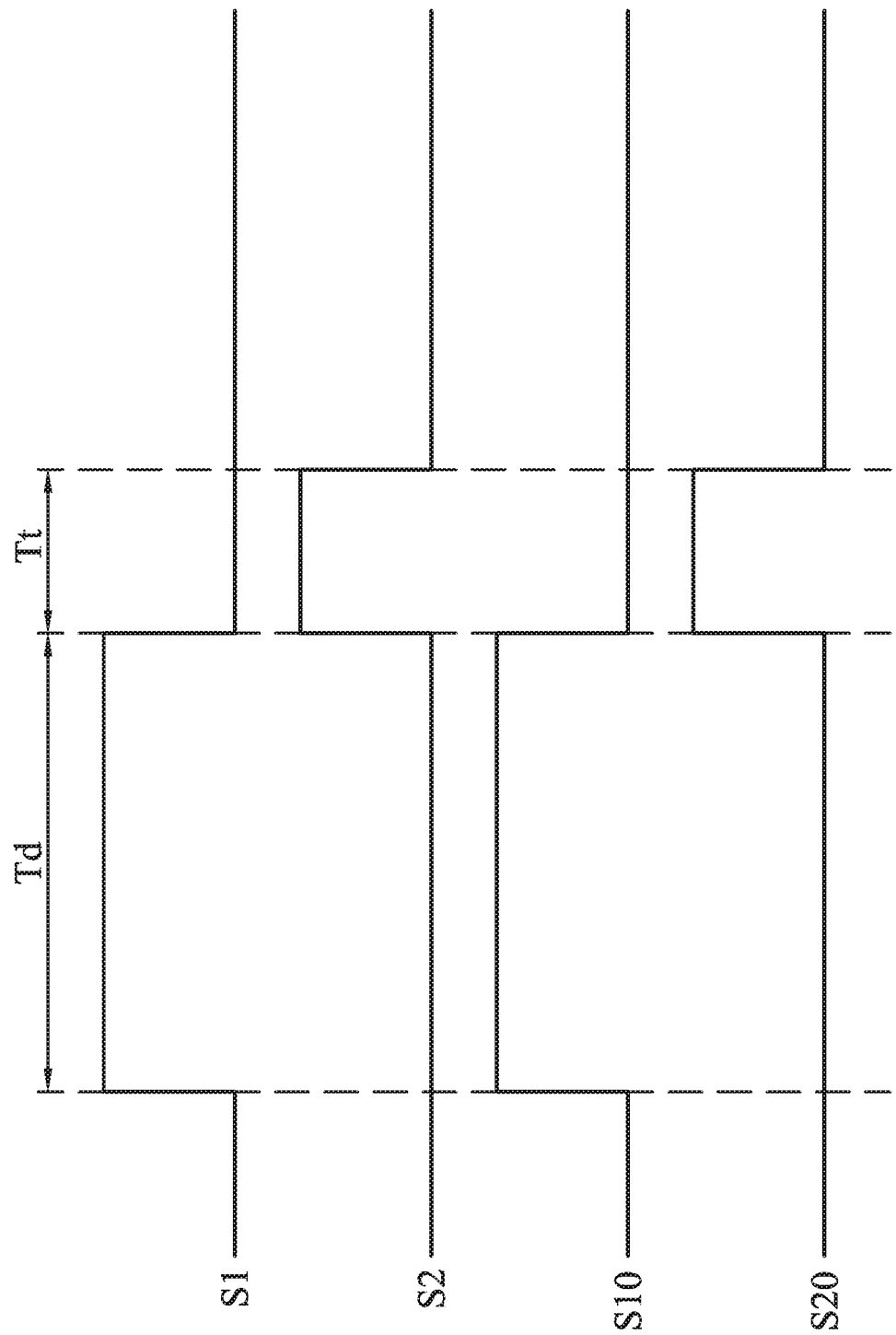
FIG. 4 shows a schematic diagram of display control signals and touch control signals of an electronic device in accordance with some embodiments of the disclosure.

In some embodiments, the electronic device 100 further includes a gate driving circuit 130, and the gate driving circuit 130 couples to the gate lines GL1-GL6. The gate driving circuit 130 is used to sequentially output driving signals SG1-SG6 to the gate lines GL1-GL6 during a display period Td (as shown in FIG. 4) of the electronic device 100. When the pixel units U11-U66 are driven according to the driving signals SG1-SG6 on the coupled gate lines GL1-GL6, the pixel units U11-U66 can load display data on the coupled data lines DL1-DL6 for screen display. Herein, the display data can be a voltage signal, and the pixel unit can display the corresponding grayscale according to the voltage of the display data.

The plurality of sensing electrodes C1-C4 may be arranged on the substrate 110 in an array, and the orthographic projections of the sensing electrodes C1-C4 in the normal direction of the substrate 110 may overlap the multiple pixel units. In the following, for the convenience of description, an orthogonal projection of one sensing electrode in the normal direction of the substrate 110 can cover 9 pixel units. For example, the orthogonal projection of the sensing electrode C1 in the normal direction of the substrate 110 can cover pixel units U11, U21, U31, U12, U22, U32, U13, U23 and U33, but the number of covered pixel units is not limited thereto.

The substrate 110 can be roughly divided into a visible area A1 and a peripheral area A2, and the peripheral area A2 is an area other than the visible area A1. In some embodiments, the peripheral area A2 is adjacent to the visible area A1. In some embodiments, the peripheral area A2 surrounds the visible area A1. Wherein the visible area A1 refers to an area that can be used to display and provide a touch operation for the user, for example, the area where the pixel units U11-U66 and/or the sensing electrodes C1-C4 are located.

The plurality of data switches B1-B6 and the plurality of touch switches E1-E4 are arranged in the peripheral area A2 of the substrate 110. Wherein the data switches B1-B6 respectively have one control end and two connection ends (hereinafter referred to as a first connection end and a second connection end, respectively), and the touch switches E1-E4 respectively have one control end and two connection ends (hereinafter referred to as a third connection end and a fourth connection end, respectively).

The first connection end of the data switches B1-B6 respectively couples to one of the plurality of data lines D1-D6. That is, the first connection end of the data switch B1 couples to the data line DL1, the first connection end of the data switch B2 couples to the data line DL2, the first connection end of the data switch B3 couples to the data line DL3, the first connection end of the data switch B4 couples to the data line DL4, the first connection end of the data switch B5 couples to the data line DL5, and the first connection end of the data switch B6 couples to the data line DL6.

The third connection end of the touch switches E1-E4 respectively couples to one of the plurality of sensing electrodes C1-C4. That is, the third connection end of the touch switch E1 couples to the sensing electrode C1, the third connection end of the touch switch E2 couples to the sensing electrode C2, the third connection end of the touch switch E3 couples to the sensing electrode C3, and the third connection end of the touch switch E4 couples to the sensing electrode C4.

The fourth connection end of the touch switches E1-E4 respectively couple to the second connection end of one of the plurality of data switches B1-B6. Herein, the data switches B1-B6 can respectively establish or disconnect the electronic connection between the first connection end and the second connection end according to the control signal received by the control end thereof. In addition, the touch switches E1-E4 can respectively establish or disconnect the electronic connection between the third connection end and the fourth connection end according to the control signal received by the control end thereof.

In some embodiments, the electronic device 100 further includes a driving integrated circuit 120, and the driving integrated circuit 120 couples to the plurality of data switches B1-B6, the plurality of touch switches E1-E4, and the gate driving circuit 130. The driving integrated circuit 120 can transmit timing signals to the gate driving circuit 130 to control the timing of the gate driving circuit 130 outputting the driving signals SG1-SG6. In addition, the driving integrated circuit 120 may control whether the plurality of data switches B1-B6 and the plurality of touch switches E1-E4 are turned on or not. Furthermore, the driving integrated circuit 120 can perform on-screen display through the turned-on data switches, such as outputting display data. Moreover, the driving integrated circuit 120 can perform touch sensing action through the turned-on touch switches, such as receiving touch-sensing signals and/or outputting touch-sensing signals.

The driving integrated circuit 120 has a plurality of transmission pins P1-P6, the transmission pins P1-P6 may respectively couple to the second connection end of one of the plurality of data switches B1-B6. Herein, the touch switches E1-E4 and the data switches coupled to the fourth connection ends of the touch switches are connected to the same transmission pin through a common trace. In this way, the number of transmission pins required for the driving integrated circuit 120 can be greatly reduced due to the common transmission pins used for touch and display, thereby reducing the size of the driving integrated circuit 120 or reducing the number of required use of the driving integrated circuit 120.

Since the number of sensing electrodes is less than the number of data lines, the number of transmission pins of the driving integrated circuit 120 may correspond to the number of data lines, but is not limited thereto. In some embodiments, if the number of sensing electrodes is greater than the number of data lines, the maximum number of transmission pins required for the driving integrated circuit 120 may correspond to the number of sensing electrodes. In other words, the maximum number of transmission pins required for the driving integrated circuit 120 may be the number of data lines plus the difference between the number of data lines and the number of sensing electrodes, but is not limited thereto.

Please refer to FIG. 1, the fourth connection ends of the touch switches E1-E4 are respectively coupled to different ones of the data switches. In other words, the data switches B1-B6 and at most one touch switch are coupled to the same transmission pin through a common trace. For example, as shown in FIG. 1, the fourth connection end of the touch switch E1 may couple to the data switch B1, and together with the data switch B1 may couple to the transmission pin P1 through a trace. The fourth connection end of the touch switch E2 may couple to the data switch B3, and together with the data switch B3 may couple to the transmission pin P3 through a trace. The fourth connection end of the touch switch E3 may couple to the data switch B4, and together with the data switch B4 may couple to the transmission pin P4 through a trace. Furthermore, the fourth connection end of the touch switch E4 may couple to the data switch B6, and together with the data switch B6 are coupled to the transmission pin P6 through a trace.

As shown in FIG. 1, the data switches B1-B6 can respectively establish or disconnect the electrical connection between the first connection end and the second connection end thereof according to a display control signal S1. Furthermore, the touch switches E1-E4 can respectively establish or disconnect the electrical connection between the third connection end and the fourth connection end thereof according to a display control signal S2.

Please refer to FIG. 1 and FIG. 4. In some embodiments, during a frame of the display period Td of the electronic device 100, the driving integrated circuit 120 can use the control signal S1 to turn on the plurality of data switches B1-B6, and can use the touch control signal S2 to disable the plurality of touch switches E1-E4, so that the transmission pins P1-P6 can be electrically connected to the data lines D1-D6 via corresponding data switches B1-B6, respectively.

Afterwards, the driving integrated circuit 120 can send a plurality of display data to the data lines DL1-DL6 through the transmission pins P1-P6, so that when the pixel units U11-U66 are driven by the corresponding driving signals SG1-SG6, respectively, the pixel units U11-U66 can display according to the display data on the data lines D1-D6.

During a frame of a touch period Tt of the electronic device 100, the driving integrated circuit 120 can use the control signal S1 to disable the data switches B1-B6, and can use the touch control signal S2 to disable the touch switches E1-E4, so that the transmission pins P1, P3, P4 and P6 can be electrically connected to corresponding sensing electrodes C1-C4 via corresponding touch switches E1-E4, respectively. Afterwards, the driving integrated circuit 120 can perform touch sensing via the transmission pins P1, P3, P4 and P6.

Please refer to FIG. 2. The fourth connection ends of the touch switches E1-E4 are respectively coupled to different ones of the data switches. Moreover, the sensing electrodes C1-C4 can be divided into at least two groups (hereinafter referred to as first group sensing electrodes and the second group of sensing electrodes, respectively).

Please refer to FIG. 2. The sensing electrodes C1 and C2 are the first group sensing electrodes, and the sensing electrodes C3 and C4 are the second group sensing electrodes. In some embodiments, the sensing electrodes C1 and C3 are the first group sensing electrodes, and the sensing electrodes C2 and C4 are the second group sensing electrodes, but is not limited thereto. Please refer to FIG. 2, the sensing electrodes C1 and C2 are used as the first group sensing electrodes, and the sensing electrodes C3 and C4 are used as the second group of sensing electrodes for illustration.

In addition, corresponding to the grouping of the sensing electrodes C1-C4, the touch switches E1-E4 can be correspondingly divided into at least two groups (hereinafter referred to as first group touch switches and second group touch switches, respectively), but is not limited thereto. Please refer to FIG. 2, the touch switches E1 and E2 coupled to the first group sensing electrodes (C1,C2) are used as the first group touch switches, and the touch switches E3 and E4 coupled to the second group sensing electrodes (C3,C4) are used as the second group touch switches. Wherein the first group touch switches can establish or disconnect the electrical connection between the third connection end and the fourth connection end thereof according to a touch control signal S21, and the second group touch switches can establish or disconnect the electrical connection between the third connection end and the fourth connection end thereof according to a touch control signal S22.

Figure 5:
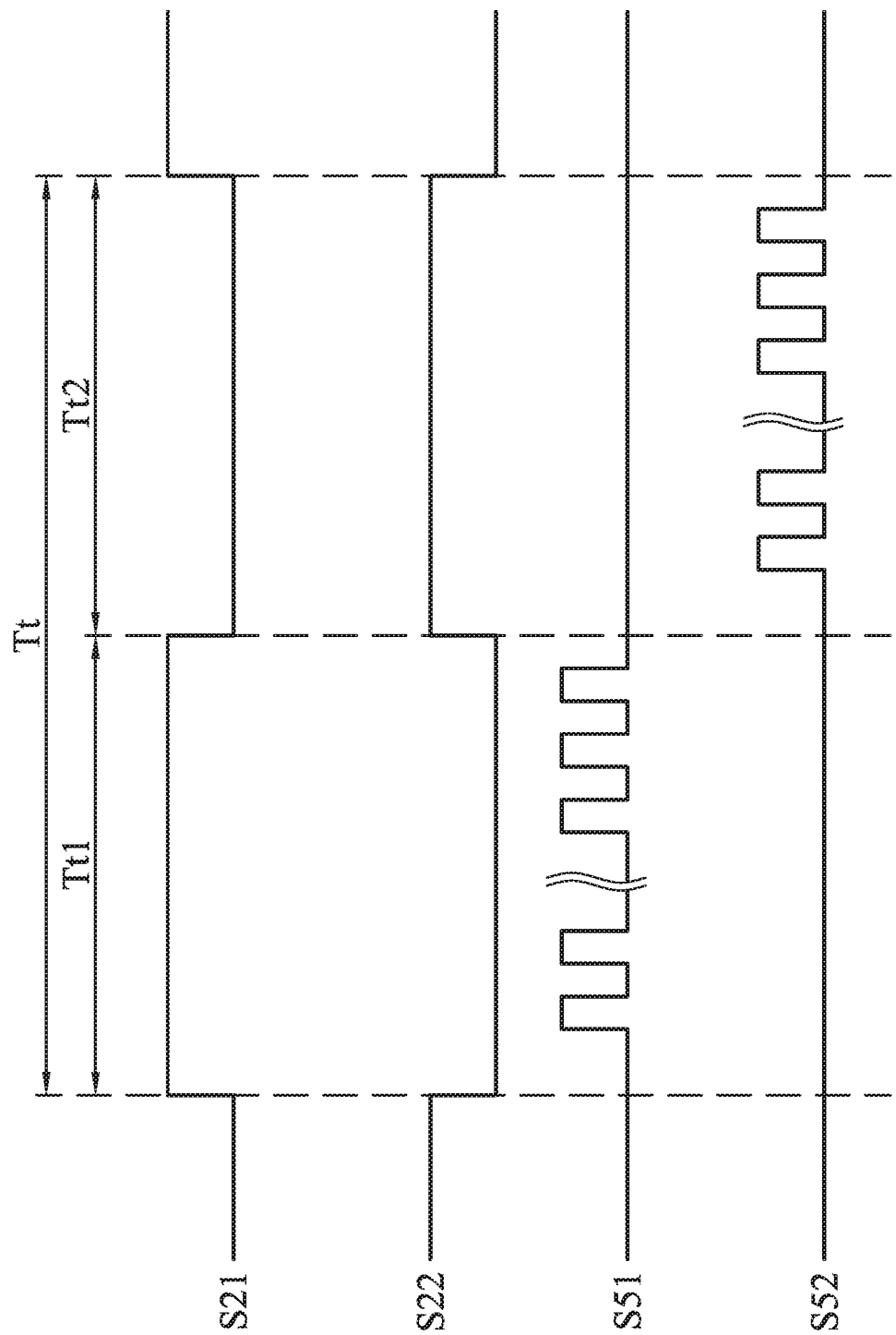
FIG. 5 shows a schematic diagram of touch control signals and signals on a sensing electrode of an electronic device in accordance with some embodiments of the disclosure.

Please refer to FIG. 2 and FIG. 5. In some embodiment, the touch period Tt of one frame can be correspondingly divided into two touch timings (hereinafter referred to as first touch timing Tt1 and second touch timing Tt2, respectively). During a frame of the first touch timing Tt1 of the touch period Tt, the driving integrated circuit 120 may first disable the data switches B1-B6 using the display control signal S1, disable the second group touch switches (that is, the touch switches E3 and E4) using a touch control signal S22, and turn on the first group touch control switches (that is, the touch switches E1 and E2) using the touch control signal S21, so that after the transmission pins P1 and P3 can be electrically connected to the corresponding sensing electrodes C1 and C2 via the first group touch switches, respectively, the driving integrated circuit 120 can perform touch sensing through the transmission pins P1 and P3. During a frame of the second touch timing Tt2 of the touch period Tt, the driving integrated circuit 120 may disable the first group touch switches using the touch control signal S21, and turn on the second group touch switches using the touch control signal S22, so that after the transmission pins P4 and P6 can be electrically connected to the corresponding sensing electrodes C3 and C4 via the second group touch switches, respectively, the driving integrated circuit 120 can perform touch sensing through the transmission pins P4 and P6.

In some embodiments, since the operation of the driving integrated circuit 120 during the display period Td is substantially the same as the above-mentioned embodiments, it will not be repeated herein.

Please refer to FIG. 3. The sensing electrodes C1-C4 can be divided into first group sensing electrodes and second group sensing electrodes, and the touch switches E1-E4 can be correspondingly divided into the first group touch switches and the second touch switches. Wherein the first group touch switches may establish or disable the electrical connection between the third connection end and the fourth connection end thereof according to the touch control signal S21, and the second group touch switches may establish or disable the electrical connection between the third connection end and the fourth connection end thereof according to the touch control signal S22. Since the grouping method can refer to the description in the above embodiment, it will not be repeated herein.

Please refer to FIG. 3. The fourth connection end of one of the touch switches in the first group touch switches and the fourth connection end of one of the touch switches in the second group touch switches are coupled to the second connection end of one of the data switches, and further are coupled to one of the transmission pins through a trace. Wherein the fourth connection ends of the touch switches E3 and E4 in the first group touch switches are respectively coupled to different ones of the data switches, and the fourth connection ends of the touch switches E3 and E4 in the second group touch switches are respectively coupled to different ones of the data switches. In other words, the data switches B1-B6 and at least two touch switches are coupled to the same transmission pin through a trace, and the two touch switches to which the data switches B1-B6 are coupled are respectively in different groups.

For example, as shown in FIG. 3, the fourth connection end of the touch switch E1 in the first group touch switches together with the fourth connection end of the touch switch E3 in the second group touch switches are coupled to the second connection end of the data switch B1, and further together with the data switch B1 are coupled to the transmission pin P1 by a trace. Moreover, the fourth connection end of the touch switch E2 in the first group touch switches couples to the second connection end of the data switch B5 with the fourth connection end of the touch switch E4 in the second group touch switches, and couples to the transmission pin P5 with the data switch B5 by a trace.

Please refer to FIG. 3 and FIG. 5. The touch period Tt of one frame can be divided as the first touch timing Tt1 and the second touch timing Tt2. During a frame of the first touch timing Tt1 of the touch period Tt, the driving integrated circuit 120 may first disable the data switches B1-B6 using the display control signal S1, disable the second group touch switches (that is, the touch switches E3 and E4) using a touch control signal S22, and turn on the first group touch control switches (that is, the touch switches E1 and E2) using the touch control signal S21, so that after the transmission pins P1 and P5 can be electrically connected to the corresponding sensing electrodes C1 and C2 via the first group touch switches, respectively, the driving integrated circuit 120 can perform touch signal sensing (such as a signal S51 in FIG. 5) through the transmission pins P1 and P5. Then, during a frame of the second touch timing Tt2 of the touch period Tt, the driving integrated circuit 120 may disable the first group touch switches using the touch control signal S21, and turn on the second group touch switches using the touch control signal S22, so that after the transmission pins P1 and P5 can be electrically connected to the corresponding sensing electrodes C3 and C4 via the second group touch switches, respectively, the driving integrated circuit 120 can perform touch signal sensing (such as a signal S52 in FIG. 5) through the transmission pins P1 and P5.

Figure 6:
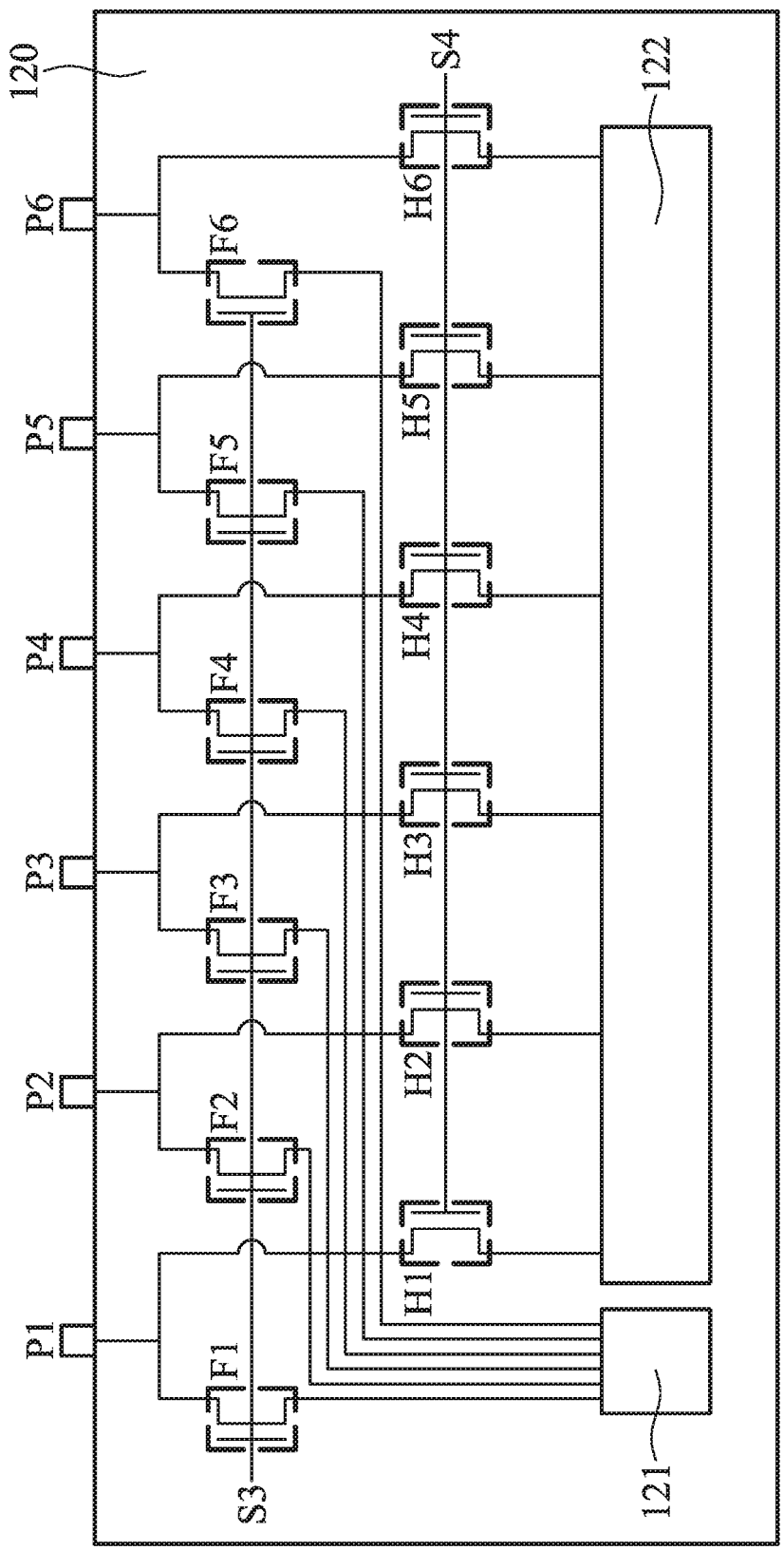
FIG. 6 shows a schematic diagram of a driving integrated circuit of an electronic device in accordance with some embodiments of the disclosure.

Please refer to FIG. 6. In some embodiments, the driving integrated circuit 120 may include a plurality of driving switches F1-F6, a plurality of detecting switches H1-H6, a driving unit 121, and a detecting unit 122. Wherein the number of driving switches F1-F6 corresponds to the number of transmission pins P1-P6. Moreover, the number of detecting switches H1-H6 corresponds to the number of transmission pins P1-P6, but is not limited thereto. The number of detecting switches H1-H6 may also correspond to the number of transmission pins P1-P6 that are common to touch and display. The following is an example in which the number of detecting switches H1-H6 corresponds to the number of transmission pins P1-P6.

The driving switches F1-F6 respectively have a control end and two connection ends (hereinafter referred to as a fifth connection end and a sixth connection end, respectively), and the detecting switches H1-H6 respectively have a control end and two connection ends (hereinafter referred to as a seventh connection end and a eighth connection end). Herein, the fifth connection ends of the driving switches F1-F6 respectively couple to the transmission pin (P1-P6) and the seventh connection ends of the detecting switches H1-H6, respectively. For example, the fifth connection end of the driving switch F1 couples to the transmission pin P1 with the seventh connection end of the detecting switch H1. The fifth connection end of the driving switch F2 couples to the transmission pin P2 with the seventh connection end of the detecting switch H2. The fifth connection end of the driving switch F3 couples to the transmission pin P3 with the seventh connection end of the detecting switch H3. The fifth connection end of the driving switch F4 couples to the transmission pin P4 with the seventh connection end of the detecting switch H4. The fifth connection end of the driving switch F5 couples to the transmission pin P5 with the seventh connection end of the detecting switch H5. Moreover, the fifth connection end of the driving switch F6 couples to the transmission pin P6 with the seventh connection end of the detecting switch H6.

The driving switches F1-F6 may respectively establish or disable the electrical connection between the fifth connection end and the sixth connection end thereof according the control signal received by the control end thereof. Moreover, the detecting switches H1-H6 may respectively establish or disable the electrical connection between the seventh connection and the eighth connection end thereof according to the control signal received by the control end thereof. Herein, the driving switches F1-F6 may establish or disable the electrical connection between the fifth connection end and the sixth connection end thereof according to the same display control signal S3, and the detecting switches H1-H6 may establish or disconnect the electrical connection between the seventh connection end and the eighth connection end according to the same touch control signal S4, but the present disclosure is not limited thereto. The detecting switches H1-H6 may also perform operations according to different touch control signals. For example, corresponding to the grouping of the touch switches E1-E4, when the first group touch switches are turned on (or disabled), the detecting switches coupled to the first group touch switches on the same transmission pin will be turned on (or disabled) accordingly, and when the second group touch switches are turned on (or disabled), the detecting switches coupled to the second group touch switches on the same transmission pin will be turned on (or disabled) accordingly. Hereinafter, for the purposes of illustration, the exemplary embodiment used in the description will be the detecting switches H1-H6 used to establish or disable the electrical connection between the seventh connection end and the eighth connection end according to the same touch control signal S4, but the disclosure is not limited thereto.

The driving unit 121 couples to the sixth connection end of the driving switches F1-F6, and detecting unit 122 couples to the eighth connection end of the detecting switches H1-H6. Please refer to FIG. 6. Herein, during a frame of the display period Td, after the driving switches F1-F6 are turned on according to the display control signal S3 and the detecting switches H1-H6 are disabled according to the touch control signal S4, the driving unit 121 can generate a plurality of display data according an image input data (for example, from a timing controller), and output the display data through the transmission pins P1-P6. Moreover, during a frame of the touch period Tt, after the driving switches F1-F6 are disabled according to the display control signal S3 and the detecting switches H1-H6 are turned on according to the touch control signal S4, the detecting unit 122 can perform touch sensing through the detecting switches H1-H6, such as receiving touch-sensing signals and/or outputting touch detection signals.

Figure 7:
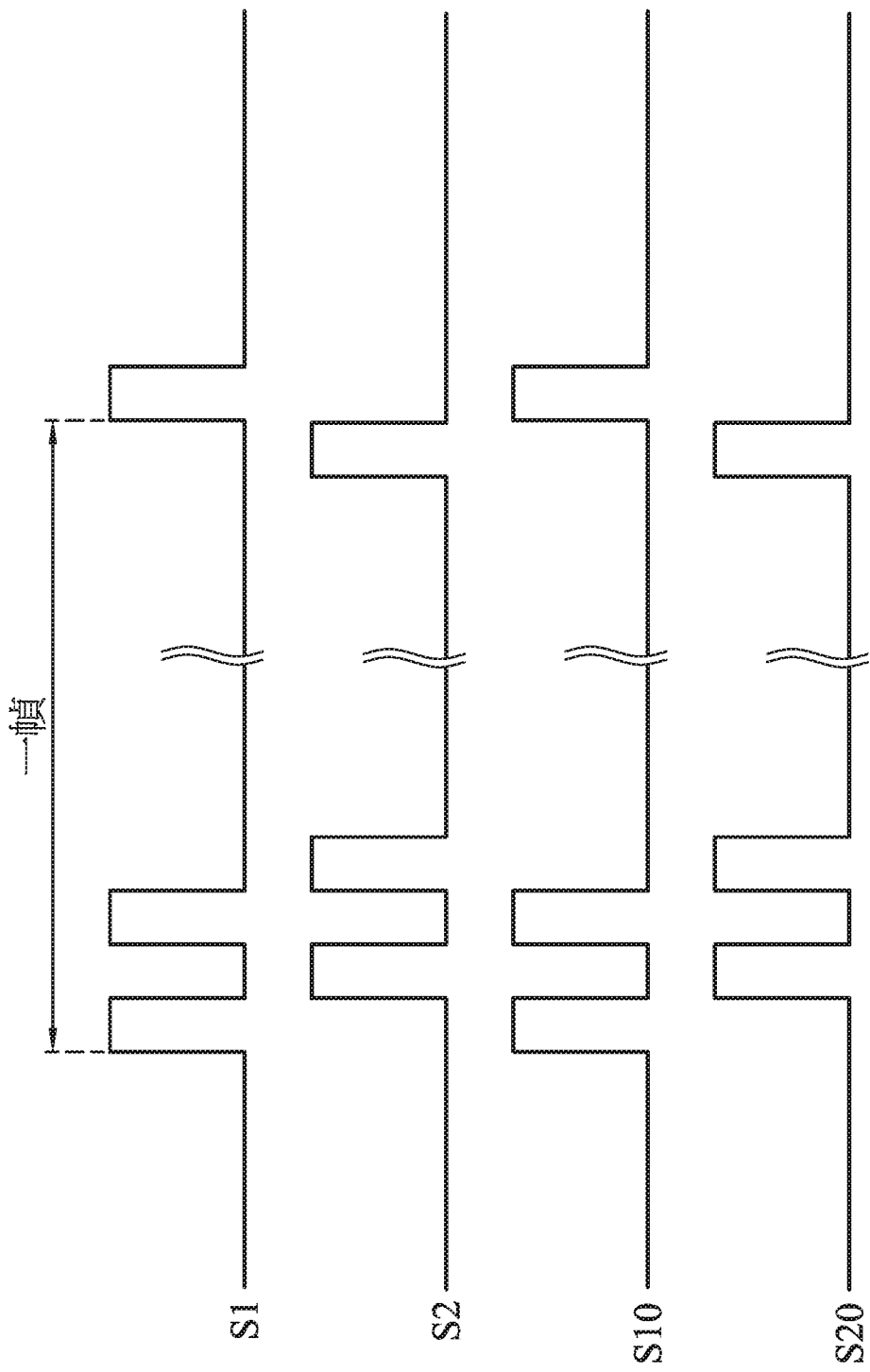
FIGS. 7 shows a schematic diagram of display control signals and touch control signals in accordance with some embodiments of the disclosure.

In some embodiments, the electronic device 100 may have two operation modes. In a first mode (such as a Long V mode), as shown in FIG. 4, the electronic device 100 first performs operations related to screen display in a frame (such as the display period Td), such as turning on the data switches B1-B6 using the display control signal Si in FIG. 4. And after completely displaying the entire screen, the electronic device 100 continuously performs operations related to touch sensing in a frame (such as the touch period Tt), such as turning on the touch switches E1-E4 using the touch control signal S2 in FIG. 4. In some embodiments, the electronic device 100 performs operations related to other screen display in a frame (such as the display period Td)(such as turning on a part of data switches using the display control signal S1 in FIG. 4, and turning on another part of the data switches using a display control signal S10). Wherein the display control signal Si and the display control signal S10 may be output by a control circuit, for example, by the driving integrated circuit 120 through the same transmission pin, or through the different transmission pins. The display control signal Si and the display control signal S10 can be performed synchronously or asynchronously, but is not limited thereto. In some embodiments, the electronic device 100 may perform operations related to other touch sensing (such as turning on a part of touch switches using the touch control signal S2 in FIG. 4, and turning on another part of the touch switches using a touch control signal S20). Wherein the touch control signal S2 and the touch control signal S20 may be output by a control circuit, for example, by the driving integrated circuit 120 through the same transmission pin, or through the different transmission pins. The display control signal S2 and the touch control signal S20 can be performed synchronously or asynchronously, but is not limited thereto. In a second mode (such as a Long H mode), as shown in FIG. 7, the electronic device 100 may alternately perform operations related to screen display and touch sensing in a frame. For example, when the electronic device 100 scans a part of pixel units (for example, N rows are scanned once), the electronic device 100 stops and performs a part of touch sensing, such as turning on a part of the data switches using the control signal Si shown in FIG. 7, and after scanning a part of the pixel units, stopping scanning, and turning on a part of the touch switches using the control signal S2 in FIG. 7 to perform parts of touch sensing; then, turning on a part of the data switches using the display control signal S10 in FIG. 7 to scan a part of pixel units and stop scanning; instead, turning on a part of the touch switches to perform parts of touch sensing, and so on until the end of a frame. Wherein the display control signal Si and the display control signal S10 may be achieved by a control circuit, for example, by the driving integrated circuit 120 through the same transmission pin, or through the different transmission pins. Wherein the touch control signal S2 and the touch control signal S20 may be achieved by a control circuit, for example, by the driving integrated circuit 120 through the same transmission pin, or through the different transmission pins.

In some embodiments, the gate driving circuit 130, the plurality of data switches B1-B6, and the plurality of touch switches E1-E4 may be directly fabricated in the peripheral area A2 of the substrate 110, for example, using a gate driver on array (GOA) technology. In addition, the driving integrated circuit 120 may be made into a chip by any suitable size of integrated technology, such as 0.35 micron (m) integrated process technology, 0.18 micron integrated process technology, etc., but the present disclosure is not limited thereto.

In some embodiments, by checking whether physical traces connected to the transmission pins P1-P6 of the driving integrated circuit 120 are coupled to the data lines and the sensing electrodes, it can be known whether the touch and display share the same transmission pin.

In the above embodiments, it should be noted that the profile of the circuit signal can be of any suitable type, and the circuit signal shown in the above embodiment takes square wave as an example, but is not limited thereto. In addition, although the square wave shown in the above embodiments is an ideal square wave, in practical applications, the provided square wave signal may be non-ideal square wave having noise, ripple effect, and/or ringing effect. Furthermore, the amplitude of the circuit signals shown in the above embodiments are only for illustration, and the relationship of the amplitude of the circuit signal is not limited to the examples shown in above embodiments.

It should be noted that the features between the various embodiments can be used in combination as long as they do not violate the spirit of the disclosure or conflict with each other.

In summary, the embodiments of the present disclosure provide an electronic device with touch switches that are directly manufactured on a substrate, so that it is not necessary to arrange touch switches in a driving integrated circuit. In addition, by sharing the transmission pins for touch and display, the number of transmission pins required to drive the integrated circuit can be greatly reduced, and the size of the driving integrated circuit or the number of driving integrated circuits required can be reduced, so that the overall cost can of materials be reduced.

The embodiments of the present disclosure are disclosed above, but they are not used to limit the scope of the present disclosure. A person skilled in the art can make some changes and retouches without departing from the spirit and scope of the embodiments of the present disclosure. Therefore, the scope of protection in the present disclosure shall be deemed as defined by the scope of the attached claims.

What is claimed is:

1. An electronic device, comprising:
   a substrate, having a peripheral area;
   a plurality of data lines, arranged on the substrate;
   a plurality of data switches, arranged in the peripheral area, wherein the plurality of data switches respectively have a first connection end and a second connection end, and the first connection end of the plurality of data switches respectively couples to one of the plurality of data lines;
   a plurality of sensing electrodes, arranged on the substrate; and
   a plurality of touch switches, arranged in the peripheral area, wherein the plurality of touch switches respectively have a third connection end and a fourth connection end, the third connection end of the plurality of touch switches respectively couples to one of the plurality of sensing electrodes, and the fourth connection end of the plurality of touch switches respectively couples to the second connection end of one of the plurality of data switches.

2. The electronic device as claimed in claim 1, further comprising:
   a driving integrated circuit, having a plurality of transmission pins, wherein the fourth connection end of the plurality of touch switches respectively with the second connection end of one of the plurality of data switches couple to one of the transmission pins.

3. The electronic device as claimed in claim 2, wherein the driving integrated circuit turns on the plurality of touch switches and disables the plurality of data switches in a touch period, and the driving integrated circuit performs touch sensing through the plurality of transmission pins couple to the plurality of touch switches.

4. The electronic device as claimed in claim 2, wherein the plurality of touch switches are separated into first group touch switches and second group touch switches, the driving integrated circuit turns on the first group touch switches during a first touch timing of a touch period, and performs touch sensing through the plurality of transmission pins coupled to the first group touch switches, and the driving integrated circuit turns on the second group touch switches during a second touch timing of the touch period, and performs touch sensing through the plurality of transmission pins coupled to the second group touch switches.

5. The electronic device as claimed in claim 1, wherein the fourth connection end of the plurality of touch switches respectively coupled to one of the plurality of data switches is different from each other.

6. The electronic device as claimed in claim 4, wherein the fourth connection end of the first group touch switches of the plurality of touch switches respectively with the fourth connection end of the second group touch switches of the plurality of touch switches and the second connection end of one of the plurality of data switches couple to one of the plurality of transmission pins.

7. The electronic device as claimed in claim 6, wherein the fourth connection end of the first group touch switches of the plurality of touch switches respectively coupled to one of the plurality of data switches is different from each other and the fourth connection end of the second group touch switches of the plurality of touch switches respectively coupled to one of the plurality of data switches is different from each other.

8. The electronic device as claimed in claim 2, wherein the driving integrated circuit turns on the plurality of data switches and disables the plurality of touch switches in a display period, and the driving integrated circuit sends a plurality of display data to the plurality of data lines through the plurality of transmission pins.

9. The electronic device as claimed in claim 2, wherein the driving integrated circuit comprises:
   a plurality of driving switches, respectively having a fifth connection end and a sixth connection end, wherein the fifth connection end of the plurality of driving switches couple to the plurality of transmission pins;
   a plurality of detecting switches, respectively having a seventh connection end and a eighth connection end, wherein the fifth connection ends of the plurality of driving switches respectively with the seventh connection end of one of the plurality of detecting switches couple to one of the plurality of transmission pins;
   a driving unit, coupled to the sixth connection end of the plurality of driving switches; and
   a detecting unit, coupled to the eighth connection end of the plurality of detecting switches.

10. The electronic device as claimed in claim 9, wherein the driving unit outputs a plurality of display data to the plurality of transmission pins through the plurality of driving switches in a display period, and the detecting unit performs touch sensing through the plurality of detecting switches in a touch period.

11. The electronic device as claimed in claim 1, wherein the number of the plurality of data switches corresponds to the number of the plurality of data lines, and the number of the plurality of touch switches corresponds to the number of the plurality of sensing electrodes.

12. The electronic device as claimed in claim 9, wherein the number of the plurality of driving switches corresponds to the number of the plurality of transmission pins, and the number of the plurality of detecting switches corresponds to the number of the plurality of transmission pins.

13. The electronic device as claimed in claim 2, wherein when the number of the plurality of sensing electrodes is less than the number of the plurality of data lines, the number of the plurality of transmission pins of the driving integrated circuit corresponds to the number of the plurality of data lines.

14. The electronic device as claimed in claim 2, wherein when the number of the plurality of sensing electrodes is more than the number of the plurality of data lines, the maximum number of the plurality of transmission pins of the driving integrated circuit corresponds to the number of the plurality of sensing electrodes.

15. The electronic device as claimed in claim 4, wherein the driving integrated circuit disables the plurality of data switches and the second group touch switches during the first touch timing of the touch period, and disables the plurality of data switches and the first group touch switches during the second touch timing of the touch period.

16. The electronic device as claimed in claim 2, further comprising a plurality of gate lines; wherein the plurality of data lines extend along a first direction and are arranged along a second direction; the plurality of gate lines extend along the second direction and are arranged along the first direction; wherein the first direction is different from the second direction.

17. The electronic device as claimed in claim 16, further comprising a plurality of pixel units; wherein the plurality of pixel units are arranged in an array on the substrate, and are coupled to the plurality of data lines and the plurality of gate lines.

18. The electronic device as claimed in claim 17, wherein the orthographic projections of the plurality of sensing electrodes in the normal direction of the substrate overlap the plurality of pixel units.

19. The electronic device as claimed in claim 17, wherein the plurality of pixel units are driven according to driving signals on the corresponding plurality of gate lines, and load display data on the corresponding plurality of data lines for screen display.

20. The electronic device as claimed in claim 16, wherein the driving integrated circuit sequentially outputs driving signals to the plurality of gate lines during a display period.

\* \* \* \* \*